(12) United States Patent
Lim et al.

(10) Patent No.: US 10,777,759 B2
(45) Date of Patent: Sep. 15, 2020

(54) FLEXIBLE DISPLAY DEVICE AND MANUFACTURING METHOD THEREOF

(71) Applicant: Samsung Display Co., Ltd., Yongin-si, Gyeonggi-do (KR)

(72) Inventors: Heung Kyoon Lim, Suwon-si (KR); Kie Hyun Nam, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/750,492

(22) Filed: Jan. 23, 2020

(65) Prior Publication Data

US 2020/0161573 A1    May 21, 2020

Related U.S. Application Data

(62) Division of application No. 15/792,483, filed on Oct. 24, 2017, now Pat. No. 10,573,831.

(30) Foreign Application Priority Data

Dec. 23, 2016 (KR) .................. 10-2016-0177825

(51) Int. Cl.
*H01L 51/00* (2006.01)
*H01L 51/52* (2006.01)
(Continued)

(52) U.S. Cl.
CPC ...... *H01L 51/0097* (2013.01); *H01L 51/5246* (2013.01); *H01L 51/5253* (2013.01);
(Continued)

(58) Field of Classification Search
CPC ............. H01L 51/0097; H01L 51/5246; H01L 51/5253; H01L 51/56; H01L 51/5259; H01L 25/048; H01L 51/529; G02B 5/20
See application file for complete search history.

(56) References Cited

U.S. PATENT DOCUMENTS

2003/0184704 A1* 10/2003 Akiyama .......... G02F 1/133305
349/158
2005/0140280 A1* 6/2005 Yamazaki ........... H01L 51/5016
313/504
(Continued)

FOREIGN PATENT DOCUMENTS

JP     2007-042499 A     2/2007
KR   10-2012-0139089 A   12/2012
(Continued)

*Primary Examiner* — Mouloucoulaye Inoussa
(74) *Attorney, Agent, or Firm* — Lewis Roca Rothgerber Christie LLP

(57) ABSTRACT

A flexible display device includes: a first flexible substrate and a second flexible substrate facing each other; a display part positioned on a surface of the first flexible substrate facing the second flexible substrate and including a plurality of thin film transistors and a plurality of light emitting elements; a color filter positioned on a surface of the second flexible substrate facing the first flexible substrate; an overcoat layer positioned between the display part and the color filter and covering the color filter; a gas barrier layer positioned between the display part and the overcoat layer and covering the overcoat layer; and an encapsulation part including a filler positioned between the display part and the gas barrier layer, and a sealant positioned at an outside of the filler, and an area of the gas barrier layer is larger than an area of the encapsulation part.

8 Claims, 11 Drawing Sheets

(51) Int. Cl.
*H01L 51/56* (2006.01)
*G02B 5/20* (2006.01)

(52) U.S. Cl.
CPC .......... *H01L 51/5259* (2013.01); *H01L 51/56* (2013.01); *G02B 5/20* (2013.01); *G02B 5/201* (2013.01); *H01L 2251/5338* (2013.01)

(56) References Cited

U.S. PATENT DOCUMENTS

| | | |
|---|---|---|
| 2005/0140282 A1 | 6/2005 | Park et al. |
| 2010/0244005 A1 | 9/2010 | Gyoda |
| 2014/0027791 A1 | 1/2014 | Cho et al. |
| 2015/0060780 A1* | 3/2015 | Hsu .................... H01L 51/0097 257/40 |
| 2015/0179725 A1* | 6/2015 | Kuji .................... H01L 51/5259 257/40 |
| 2016/0293891 A1 | 10/2016 | Son |
| 2016/0306210 A1 | 10/2016 | Oh et al. |

FOREIGN PATENT DOCUMENTS

| | | |
|---|---|---|
| KR | 10-2013-0117112 A | 10/2013 |
| KR | 10-2014-0031004 A | 3/2014 |

* cited by examiner

FLEXIBLE DISPLAY DEVICE AND MANUFACTURING METHOD THEREOF

CROSS-REFERENCE TO RELATED APPLICATIONS

This application is a divisional of U.S. patent application Ser. No. 15/792,483, filed on Oct. 24, 2017, which claims priority to and the benefit of Korean Patent Application No. 10-2016-0177825, filed on Dec. 23, 2016 in the Korean Intellectual Property Office, the entire content of each of which is incorporated herein by reference.

BACKGROUND

1. Field

Aspects of embodiments of the present disclosure relate to a flexible display device.

2. Description of the Related Art

A typical organic light emitting diode display device includes a substrate, a display part positioned on the substrate and including a plurality of thin film transistors and a plurality of organic light emitting diodes, and an encapsulation part that seals the display part to block moisture and oxygen included in outside air from penetrating thereto.

In a case of a small-sized organic light emitting diode display device, the encapsulation part may be a thin film encapsulation in which a plurality of inorganic layers and a plurality of organic layers are alternately stacked one by one. In a middle-sized or large-sized organic light emitting diode display device, the encapsulation part may include a sealing substrate made of a glass material and a sealant for integrally bonding edges of a substrate and the sealing substrate.

In a case of a large-sized flexible organic light emitting diode display device, it is difficult to realize flexibility of a sealing substrate made of a glass material, and it is disadvantageous to realize a display device to be thin. The thin film encapsulation has excellent flexibility, but when it is applied to a long manufacturing process, a yield (proportion of output to input of goods) is low.

The above information disclosed in this Background section is only for enhancement of understanding of the background of the described technology and, therefore, it may contain information that does not form the prior art that is already known in this country to a person of ordinary skill in the art.

SUMMARY

According to an aspect of embodiments of the present invention, a large and thin flexible display device and a manufacturing method thereof may improve a sealing effect of a display part, without a sealing substrate made of a glass material, or a thin film encapsulation.

According to one or more exemplary embodiments, a flexible display device includes: a first flexible substrate, a second flexible substrate, a display part, a color filter, an overcoat layer, a gas barrier layer, and an encapsulation part. The first flexible substrate and the second flexible substrate face each other. The display part is positioned on a surface of the first flexible substrate facing the second flexible substrate, and includes a plurality of thin film transistors and a plurality of light emitting elements. The color filter is positioned on a surface of the second flexible substrate facing the first flexible substrate. The overcoat layer is positioned between the display part and the color filter, and covers the color filter. The gas barrier layer is positioned between the display part and the overcoat layer, and covers the overcoat layer. The encapsulation part includes a filler positioned between the display part and the gas barrier layer, and a sealant positioned at an outside of the filler. An area of the gas barrier layer is larger than an area of the encapsulation part.

An outer side of the sealant may be spaced apart from an outer edge of the gas barrier layer in a direction toward a center of the display part. The encapsulation part may further include a getter layer positioned between the filler and the sealant.

An area of the gas barrier layer may be larger than that of the overcoat layer. The gas barrier layer may be formed as a single layer made of one of a silicon nitride, a silicon oxide, and a silicon oxynitride, or a stacked layer thereof.

In a manufacturing method of a flexible display device according to one or more exemplary embodiments, a buffer layer and a display part are arranged on a first flexible substrate. An encapsulation part including a filler covering the display part and a sealant positioned at an outer edge of the filler is arranged on the display part. A second flexible substrate is arranged on a carrier substrate. A color filter including a plurality of filter layers and a dark colored layer is arranged on the second flexible substrate. An overcoat layer and a gas barrier layer are arranged on the color filter. The first flexible substrate and the second flexible substrate are stacked such that the encapsulation part and the gas barrier layer contact each other, and then the sealant is cured. The carrier substrate is separated from the second flexible substrate.

The first flexible substrate may include glass, and the second flexible substrate may be a plastic film. A process temperature of the color filter and a process temperature of the gas barrier layer may be higher than a process temperature of the display part. An area of the gas barrier layer may be larger than an area of the overcoat layer and an area of the encapsulation part, and an outer side of the sealant may be spaced apart from an outer edge of the gas barrier layer in a direction toward a center of the display part.

In a manufacturing method of a flexible display device according to one or more exemplary embodiments, a first flexible substrate is arranged on a carrier substrate. A buffer layer and a display part are arranged on the first flexible substrate. An encapsulation part including a filler covering the display part, and a sealant positioned at an outside of the filler is arranged on the display part. A second flexible substrate is arranged on another carrier substrate. A color filter including a plurality of filter layers and a dark colored layer is arranged on the second flexible substrate. An overcoat layer and a gas barrier layer are arranged on the color filter. The first flexible substrate and the second flexible substrate are stacked such that the encapsulation part and the gas barrier layer contact each other, and then the sealant is cured. The carrier substrate is separated from the first flexible substrate, and the another carrier substrate is separated from the second flexible substrate.

The first flexible substrate and the second flexible substrate may be plastic films. A process temperature of the color filter and a process temperature of the gas barrier layer may be higher than a process temperature of the display part. An area of the gas barrier layer may be larger than an area of the overcoat layer and an area of the encapsulation part, and an outer side of the sealant may be spaced apart from an outer edge of the gas barrier layer in a direction toward a center of the display part.

According to an aspect of the flexible display device according to one or more exemplary embodiments, it is possible to ensure sealing performance of a display part, to have a large size and a thin thickness, and increase a manufacturing yield.

DETAILED DESCRIPTION

Figure 1:
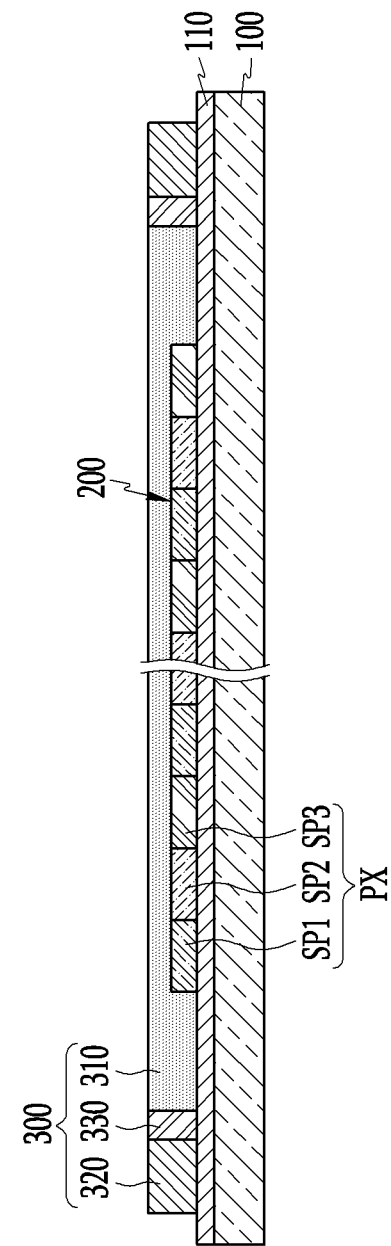
FIG. 1 to FIG. 4 illustrate cross-sectional views of a manufacturing process of a flexible display device, according to an exemplary embodiment.

The present disclosure will be described more fully herein with reference to the accompanying drawings, in which some exemplary embodiments of the disclosure are shown. As those skilled in the art would realize, the described embodiments may be modified in various different ways, all without departing from the spirit or scope of the present disclosure.

To more clearly describe the present disclosure, portions which do not relate to the description may be omitted, and like reference numerals designate like elements throughout the specification.

Further, the size and thickness of each component shown in the drawings may be arbitrarily shown for better understanding and ease of description, but the present disclosure is not limited thereto. In the drawings, the thicknesses of layers, films, panels, regions, areas, etc., may be exaggerated for clarity.

It is to be understood that when an element, such as a layer, film, region, or substrate is referred to as being "on" another element, it may be directly on the other element, or one or more intervening elements may also be present. In contrast, when an element is referred to as being "directly on" another element, there are no intervening elements present.

Further, in the specification, words such as "on" or "above" mean positioned on or below the object portion, and do not necessarily mean positioned on the upper side of the object portion based on a gravitational direction.

In addition, unless explicitly described to the contrary, the word "comprise" and variations such as "comprises" or "comprising" are to be understood to imply the inclusion of stated elements but not the exclusion of any other elements.

Herein, a manufacturing method of a flexible display device according to an exemplary embodiment will be described with reference to FIG. 1 to FIG. 4. FIG. 1 to FIG. 4 illustrate cross-sectional views of a manufacturing process of a flexible display device, according to an exemplary embodiment.

Referring to FIG. 1, a buffer layer 110 and a display part 200 are sequentially formed on a first flexible substrate 100, and an encapsulation part 300 is formed on the display part 200.

The first flexible substrate 100 may be made of thin glass that may be bent by an external force. The thin glass has a higher shape maintaining force than a plastic film that may be used as a flexible substrate, and, thus, it may maintain flatness and be easily handled in a manufacturing process without an additional carrier substrate.

The buffer layer 110 prevents or substantially prevents impurities from penetrating into the display part 200 and flattens a surface on which the display part 200 is positioned. The buffer layer 110 may be formed as a single layer made of one of a silicon nitride (SiNx), a silicon oxide (SiOx), and a silicon oxynitride (SiON), or a stacked layer thereof.

The buffer layer 110 may entirely cover a surface of the first flexible substrate 100, and the display part 200 has a smaller area than the first flexible substrate 100 in consideration of disposition of wires, control elements, and a sealant 320 described further later herein.

The display part 200 is formed on the buffer layer 110. The display part 200 includes a plurality of thin film transistors, a plurality of capacitors, and a plurality of light emitting elements. The display part 200 includes a plurality of pixels PX, and each pixel PX may include a plurality of subpixels, such as, a red subpixel SP1, a green subpixel SP2, and a blue subpixel SP3, for example. In an embodiment, at least two thin film transistors, at least one capacitor, and one light emitting element are positioned for each of the subpixels SP1, SP2, and SP3.

In an embodiment, the buffer layer 110 may be formed by a high temperature chemical vapor deposition (CVD) process at 100° C. or more, and the display part 200 may be formed by a low temperature chemical vapor deposition (CVD) process at 100° C. or less. A further detailed structure of the display part 200 will be described later herein.

The encapsulation part 300 is formed on the display part 200. The encapsulation part 300 includes a filler 310 covering the display part 200, and a sealant 320 positioned on the buffer layer 110 at an outside, or along an edge, of the filler 310. The encapsulation part 300 may include a getter layer 330 positioned between the filler 310 and the sealant 320.

The filler 310 absorbs external impact, and allows the first flexible substrate 100 and a second flexible substrate described later herein to be spaced apart from each other by a distance (e.g., a predetermined distance). The filler 310 may include a material with high transmittance, such as, one of an epoxy, polyimide, urethane acrylate, epoxy acrylate, and silicone-based resin, for example.

In an embodiment, the sealant 320 may include an ultraviolet ray curing resin. The getter layer 330 absorbs oxygen and moisture to prevent deterioration of the display part 200 due to the oxygen and the moisture. The getter layer 330 may include a mixture of a metal oxide, such as calcium oxide (CaO) and selenium oxide (SeO), in a powder form, and an acrylic resin. The filler 310 has an area that is larger than that of the display part 200 and smaller than that of the buffer layer 110, and the sealant 320 and the getter layer 330 are positioned on the buffer layer 110 at an outer side of the filler 310.

Figure 2:
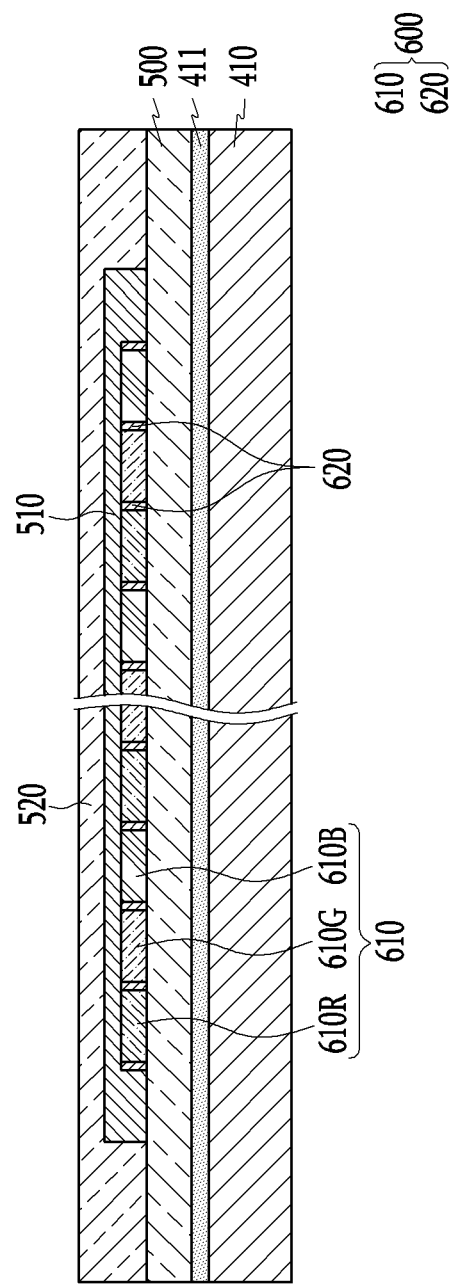

Referring to FIG. 2, a first carrier substrate 410 is prepared, and then a first sacrificial layer 411 is formed on the first carrier substrate 410. A second flexible substrate 500 is formed on the first sacrificial layer 411 or a previously manufactured second flexible substrate 500 is disposed thereon, and a color filter 600, an overcoat layer 510, and a gas barrier layer 520 are sequentially formed on the second flexible substrate 500.

The first carrier substrate 410 is made of a rigid material, such as glass or a metal, and the first sacrificial layer 411 may include amorphous silicon, a metal, an organic material, or the like.

In the manufacturing process of the flexible display device, the first carrier substrate 410 supports the second flexible substrate 500, maintains flatness thereof, and allows it to be easily handled. In a final manufacturing process, the first carrier substrate 410 is separated from the second flexible substrate 500.

When the second flexible substrate 500 is formed on the first sacrificial layer 411, the second flexible substrate 500 may be formed in a method in which a transparent resin is coated on the first sacrificial layer 411 and then cured. In an embodiment, the second flexible substrate 500 may include one of polyethylene terephthalate, polyethylene naphthalate, and polyimide.

The color filter 600 is formed on the second flexible substrate 500. The color filter 600 includes a plurality of filter layers 610 and dark colored layers 620 positioned between the plurality of filter layers 610. In an embodiment, the plurality of filter layers 610 may include a red filter layer 610R corresponding to the red subpixel SP1, a green filter layer 610G corresponding to the green subpixel SP2, and a blue filter layer 610 6 corresponding to the blue subpixel SP3.

The filter layers 610 absorb light of remaining wavelengths except for wavelengths corresponding to their respective colors among incident external light (of visible light wavelengths). In addition, the dark colored layer 620 absorbs most of incident external light. Accordingly, when light emitted from any of the subpixels SP1, SP2, and SP3 of predetermined colors passes through the respective filter layer 610 and is emitted to the outside, since the light does not mix with external light of another wavelength, the color filter 600 suppresses reflection of the external light and increases color purity.

In an embodiment, the plurality of filter layers 610 may include an acrylic resin or a polyimide-based resin, and the dark colored layers 620 may include one of chromium (Cr), chromium oxide (CrOx), chromium nitride (CrNx), carbon black, a pigment mixture, and a dye mixture.

In an embodiment, a process temperature of the color filter 600 is equal to or greater than 100° C., and is higher than that of the display part 200. If the color filter 600 were directly formed on the encapsulation part 300, the display part 200 may be damaged due to the process temperature of the color filter 600. Therefore, instead of being formed on the encapsulation part 300, the color filter 600 is formed on the second flexible substrate 500, thereby preventing damage to the display part 200.

The overcoat layer 510 is formed on the color filter 600. The overcoat layer 510 protects the color filter 600, improving reliability of the color filter 600. In an embodiment, the overcoat layer 510 may include an acrylic resin or a polyimide-based resin. An area of the overcoat layer 510 may be larger than that of the color filter 600 and smaller than that of the second flexible substrate 500.

The gas barrier layer 520 is formed on the overcoat layer 510. The gas barrier layer 520 blocks diffusion of out-gas emitted from the color filter 600, thereby suppressing deterioration of the display part 200. The gas barrier layer 520 may have a larger area than the overcoat layer 510, and may have the same area as the second flexible substrate 500.

In an embodiment, the gas barrier layer 520 may be formed as a single layer made of one of a silicon nitride (SiNx), a silicon oxide (SiOx), and a silicon oxynitride (SiON), or a stacked layer thereof. In an embodiment, the gas barrier layer 520 may be formed by a high temperature chemical vapor deposition (CVD) process at 100° C. or more. However, the process temperature of the gas barrier layer 520 is lower than a decomposition start temperature (i.e. about 230° C.) of the color filter 600 and the overcoat layer 510 such that the color filter 600 and the overcoat layer 510 may be separated from each other at the process temperature of the gas barrier layer 520.

Figure 3:
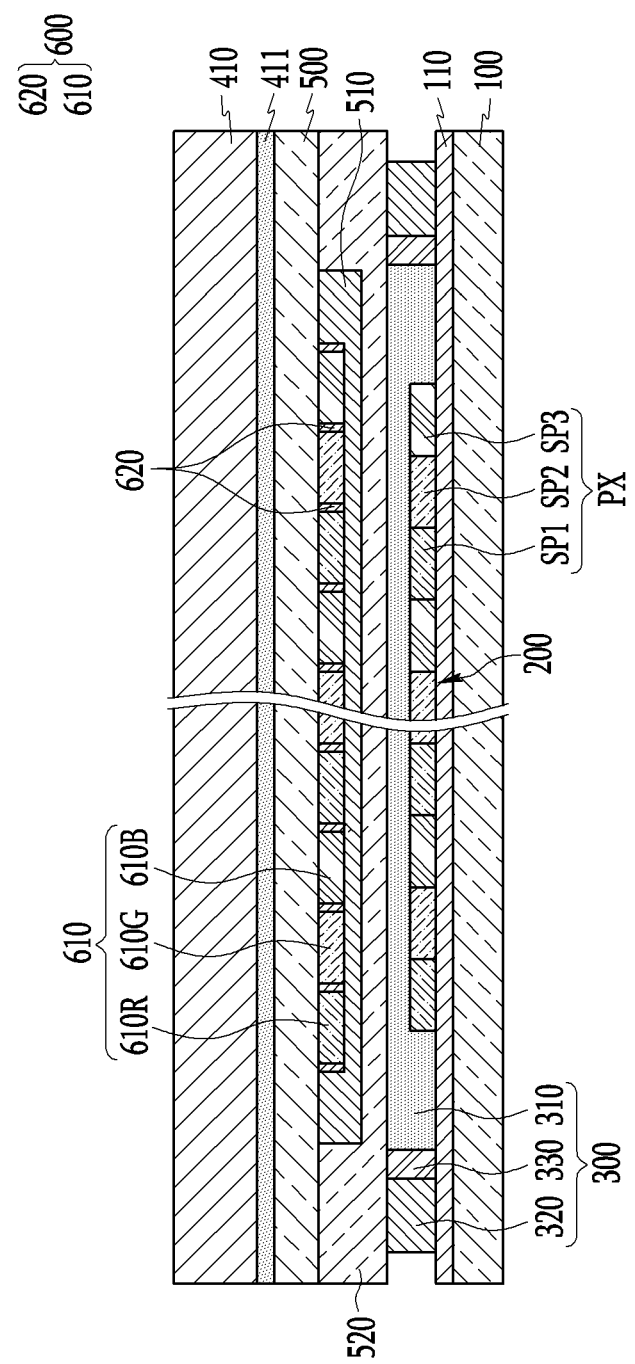

Referring to FIG. 3, the first flexible substrate 100 and the second flexible substrate 500 are overlapped with each other such that the encapsulation part 300 and the gas barrier layer 520 contact each other. In FIG. 3, it is illustrated that the second flexible substrate 500 is positioned on the first flexible substrate 100, but, conversely, it is also possible for the first flexible substrate 100 to be positioned on the second flexible substrate 500.

The first flexible substrate 100 and the second flexible substrate 500 are integrally bonded by the curing of the sealant 320. In an embodiment, the sealant 320 includes an ultraviolet ray curing resin, and an ultraviolet ray irradiating device (not shown) is used to irradiate ultraviolet rays to the sealant 320.

Figure 4:
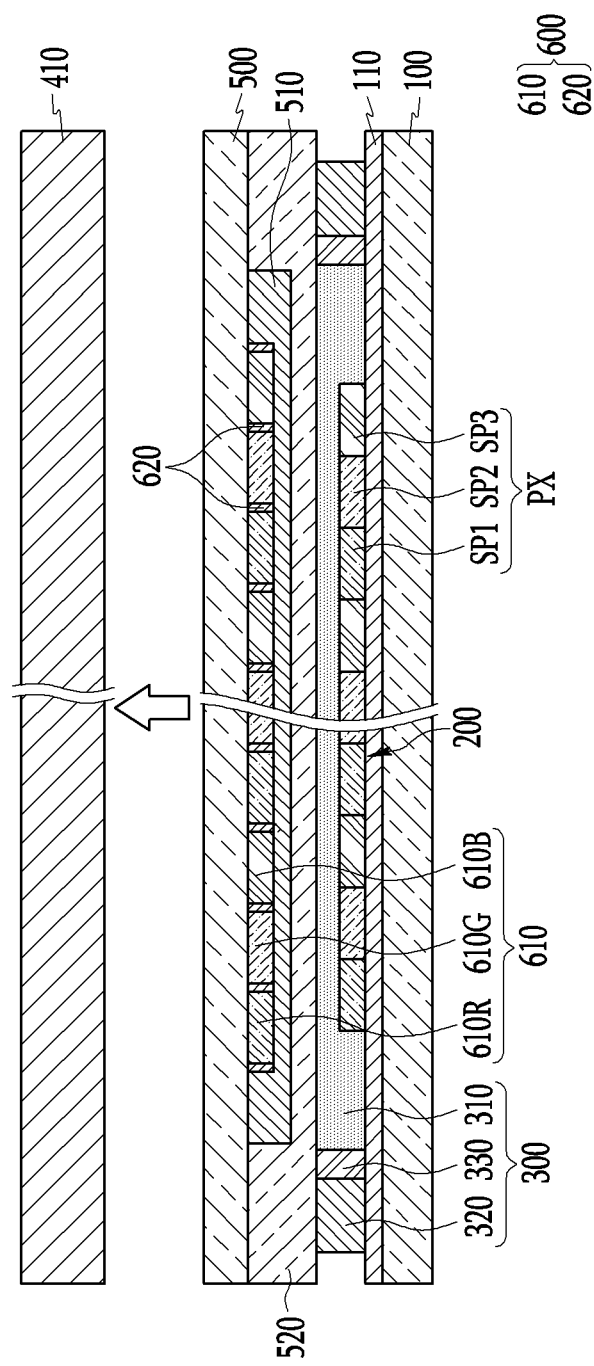

Referring to FIG. 4, the first carrier substrate 410 is separated from the second flexible substrate 500. In an embodiment, for example, the first sacrificial layer 411 includes amorphous silicon, and it is possible to separate the first carrier substrate 410 and the second flexible substrate 500 by irradiating a laser beam to the first sacrificial layer 411 to eliminate the first sacrificial layer 411. In this case, any of various types of lasers, such as an excimer laser, a solid state laser, and a pulse laser, may be used.

After the first carrier substrate 410 is separated, a passivation film (not shown) may be attached to an outer surface of the second flexible substrate 500. The passivation film protects the second flexible substrate 500 from external impact and scratches.

Figure 5:
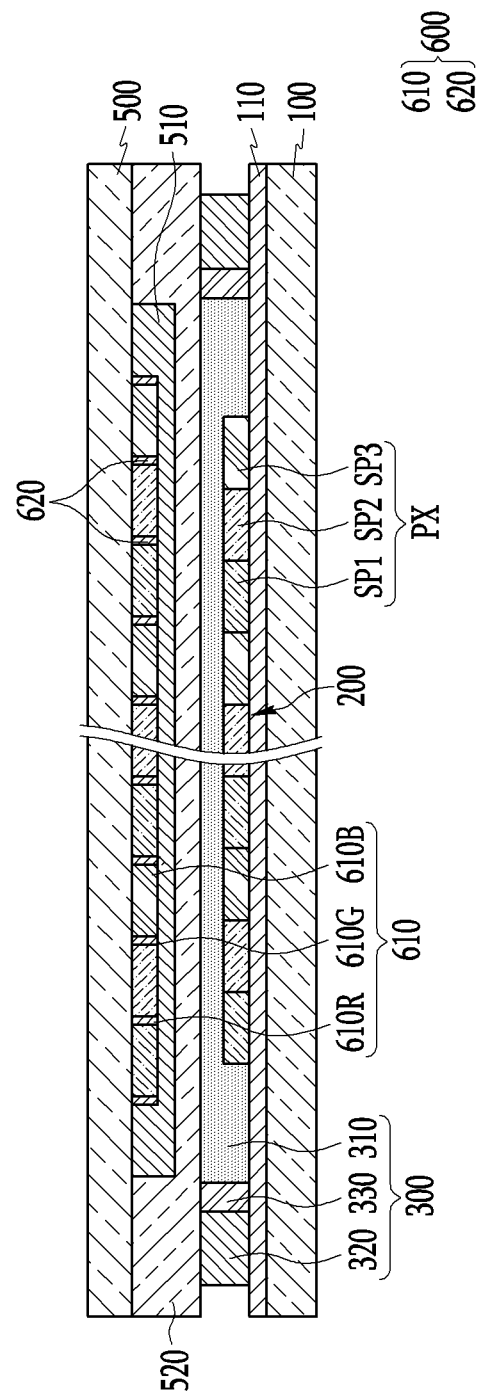
FIG. 5 illustrates a cross-sectional view of a flexible display device according to an exemplary embodiment.

A flexible display device according to an exemplary embodiment will be described with reference to FIG. 5. FIG. 5 illustrates a cross-sectional view of a flexible display device according to an exemplary embodiment, such as manufactured by the manufacturing method of the flexible display device according to the exemplary embodiment shown in FIG. 1 to FIG. 4. Further detailed descriptions for the respective constituent elements described with reference to FIG. 1 to FIG. 4 will be omitted.

Referring to FIG. 5, an area of the gas barrier layer 520 is larger than that of the encapsulation part 300 including the filler 310, the sealant 320, and the getter layer 330. A surface of the sealant 320 arranged toward the second flexible substrate 500 contacts a surface of the gas barrier layer 520, and an outer side surface of the sealant 320 is spaced apart from an edge of the gas barrier layer 520 at a distance (e.g., a predetermined distance) toward the display part 200.

Accordingly, the gas barrier layer 520, the sealant 320, the getter layer 330, and the filler 310 are sequentially positioned along a surface direction or lateral direction (e.g., a horizontal direction with respect to the drawing) of the first flexible substrate 100 or the second flexible substrate 500 from an outer side of the flexible display device. That is, the gas barrier layer 520 may extend further toward the outer side of the flexible display device than the sealant 320, the getter layer 330, and the filler 310.

The gas barrier layer 520 blocks out-gas of the color filter 600 from diffusing into the display part 200, and also blocks moisture and oxygen contained in outside air from diffusing or penetrating toward the display unit 200. The gas barrier layer 520 and the encapsulation part 300 seal the display part 200, preventing or substantially preventing the moisture and oxygen contained in the outside air from penetrating into the display part 200.

The flexible display device of the above-described exemplary embodiment uses an excellent flexible and thin plastic film as the sealing substrate (i.e. the second flexible substrate 500), and includes the encapsulation part 300 including the filler 310, the sealant 320, and the getter layer 330 instead of a thin film encapsulation having a low yield in a long manufacturing process. Accordingly, the flexible display device according to an exemplary embodiment may be large and thin, and a high manufacturing yield may be obtained.

A manufacturing method of a flexible display device according to another exemplary embodiment will be described with reference to FIG. 6 to FIG. 9. FIG. 6 to FIG. 9 illustrate cross-sectional views of a manufacturing process of a flexible display device, according to another exemplary embodiment.

Figure 6:
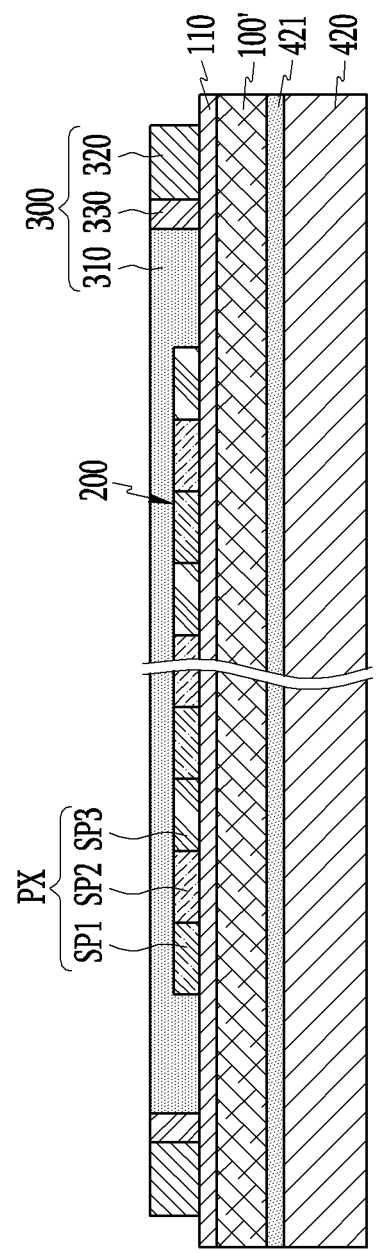
FIG. 6 to FIG. 9 illustrate cross-sectional views of a manufacturing process of a flexible display device, according to another exemplary embodiment.

Referring to FIG. 6, a second carrier substrate 420 is prepared, and then a second sacrificial layer 421 is formed on the second carrier substrate 420. A first flexible substrate 100' is formed on the second sacrificial layer 421, or a previously manufactured first flexible substrate 100' is disposed thereon. The buffer layer 110 and the display part 200 are sequentially formed on the first flexible substrate 100', and the encapsulation part 300 is formed on the display part 200.

In an embodiment, the second carrier substrate 420 is made of a rigid material such as glass or a metal, and the second sacrificial layer 421 may include amorphous silicon, a metal, an organic material, or the like.

When the first flexible substrate 100' is formed on the second sacrificial layer 421, the first flexible substrate 100' may be formed in a method in which a transparent resin is coated on the second sacrificial layer 421 and then cured. In an embodiment, the first flexible substrate 100' may include one of polyethylene terephthalate, polyethylene naphthalate, and polyimide.

The buffer layer 110 and the display part 200 are sequentially formed on the first flexible substrate 100', and the encapsulation part 300 is formed on the display part 200. The buffer layer 110, the display part 200, and the encapsulation part 300 may be the same as in the above-described exemplary embodiment, and a duplicate description thereof will be omitted.

Figure 7:
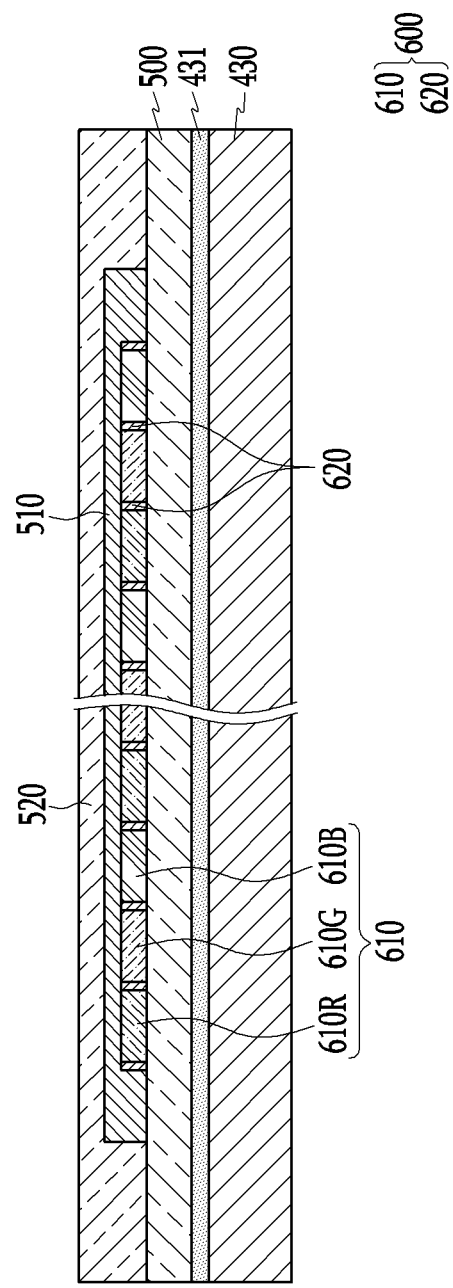

Referring to FIG. 7, a third carrier substrate 430 is prepared, and then a third sacrificial layer 431 is formed on the third carrier substrate 430. The second flexible substrate 500 is formed on the third sacrificial layer 431, or a previously manufactured second flexible substrate 500 is disposed thereon. The color filter 600, the overcoat layer 510, and the gas barrier layer 520 are sequentially formed on the second flexible substrate 500.

The third carrier substrate 430 and the third sacrificial layer 431 may be the same as the first carrier substrate 410 and the first sacrificial layer 411 of the above-described exemplary embodiment, and the color filter 600, the overcoat layer 510, and the gas barrier layer 520 may be the same as those of the above-described exemplary embodiment, and a duplicate description thereof will be omitted.

Figure 8:
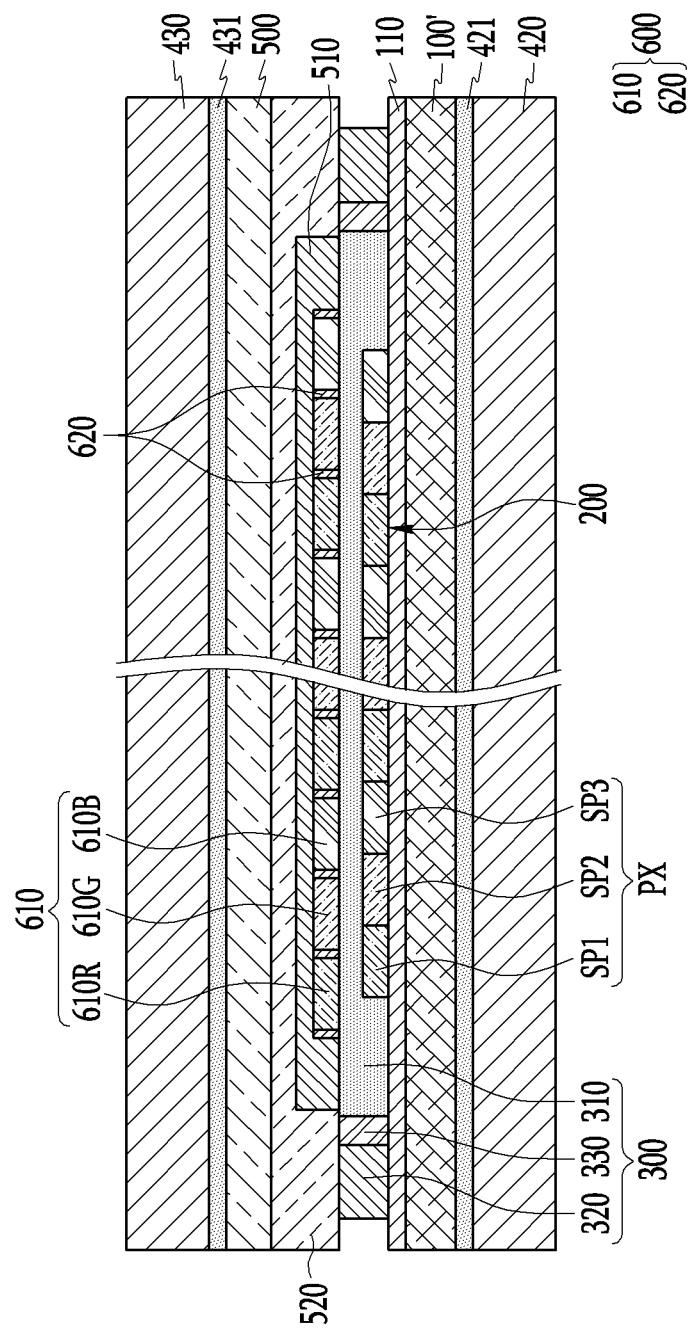

Referring to FIG. 8, the first flexible substrate 100 and the second flexible substrate 500 are overlapped with each other such that the encapsulation part 300 and the gas barrier layer 520 contact each other, and the first flexible substrate 100' and the second flexible substrate 500 are integrally bonded by curing of the sealant 320.

Figure 9:
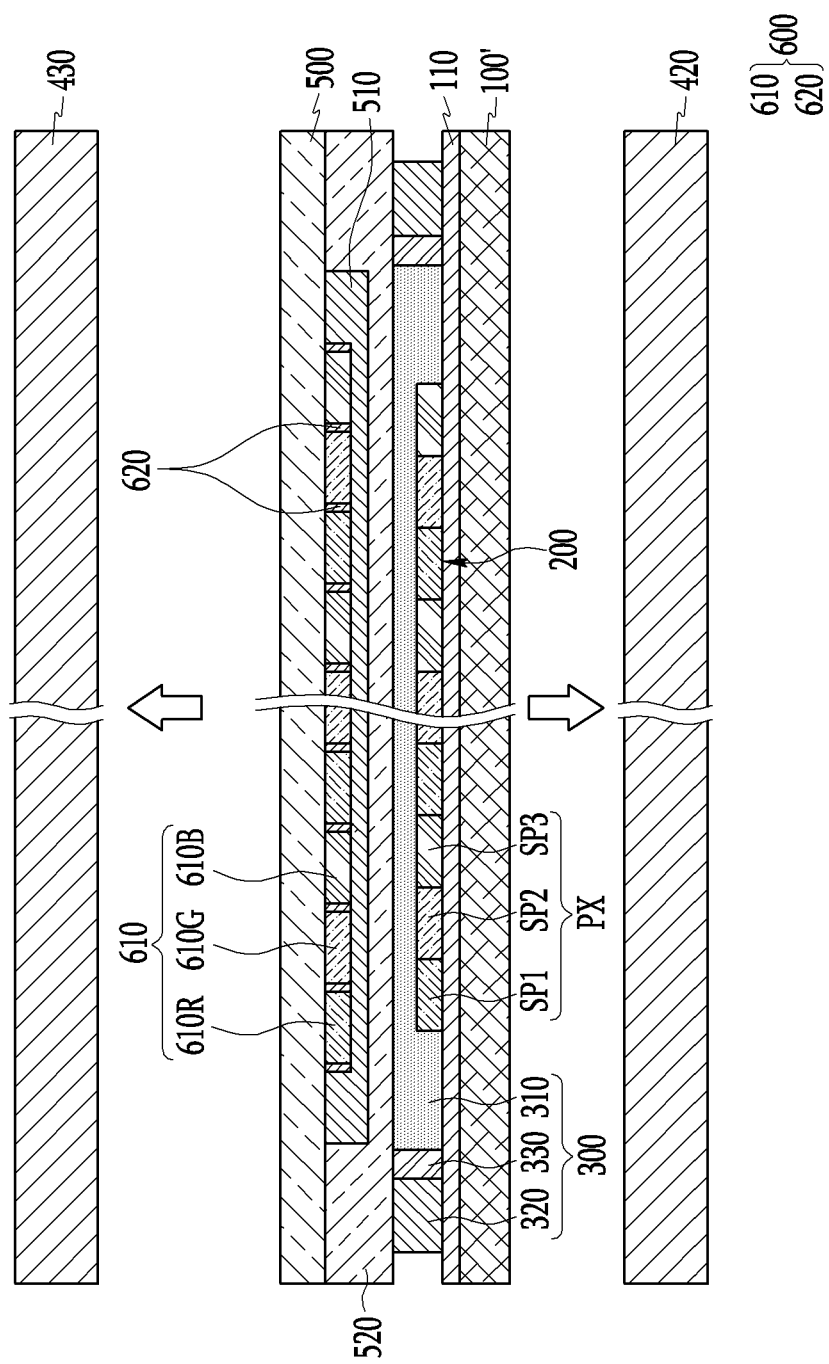

Referring to FIG. 9, the second carrier substrate 420 is separated from the first flexible substrate 100', and the third carrier substrate 430 is separated from the second flexible substrate 500. In an embodiment, for example, the second sacrificial layer 421 and the third sacrificial layer 431 include amorphous silicon, and it is possible to separate the second carrier substrate 420 and the third carrier substrate 430 by irradiating a laser beam to the second sacrificial layer 421 and the third sacrificial layer 431 to eliminate the second sacrificial layer 421 and the third sacrificial layer 431.

After the second carrier substrate 420 and the third carrier substrate 430 are separated, passivation films (not shown) may be attached to outer surfaces of the first flexible substrate 100' and the second flexible substrate 500. The passivation films protect the first flexible substrate 100' and the second flexible substrate 500 from external impact and scratches.

Figure 10:
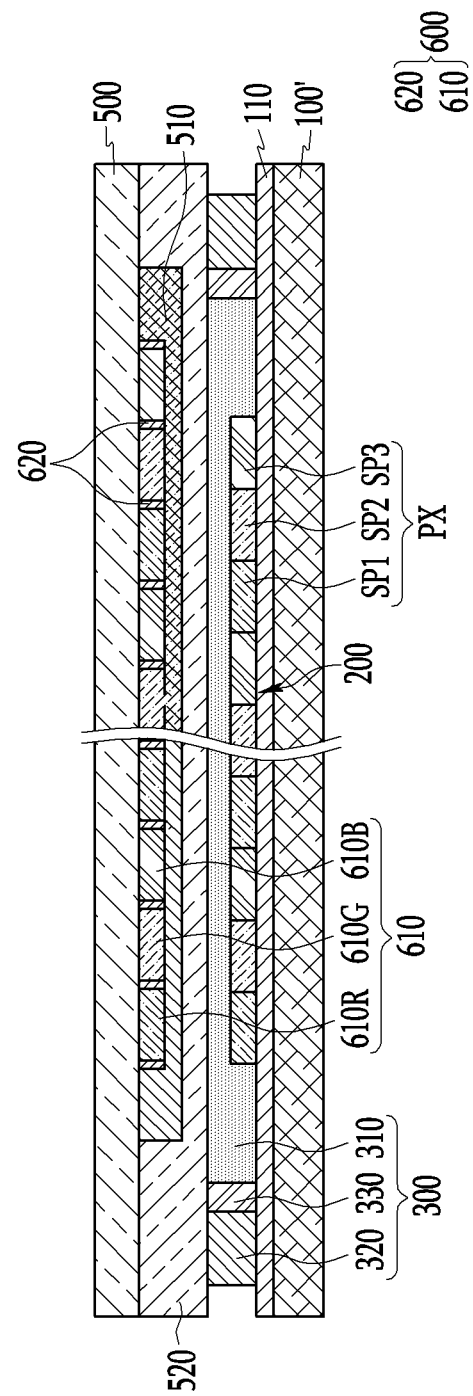
FIG. 10 illustrates a cross-sectional view of a flexible display device according to an exemplary embodiment.

A flexible display device according to an exemplary embodiment will be described with reference to FIG. 10. FIG. 10 illustrates a cross-sectional view of the flexible display device according to an exemplary embodiment, such as manufactured by the method described above with reference to FIG. 6 to FIG. 9.

Referring to FIG. 10, the area of the gas barrier layer 520 is larger than that of the encapsulation part 300 including the filler 310, the sealant 320, and the getter layer 330. A surface of the sealant 320 arranged toward the second flexible substrate 500 contacts a surface of the gas barrier layer 520, and an outer side surface of the sealant 320 is spaced apart from an edge of the gas barrier layer 520 at a distance (e.g., a predetermined distance) toward the display part 200.

Accordingly, the gas barrier layer 520, the sealant 320, the getter layer 330, and the filler 310 are sequentially positioned along a surface direction or lateral direction (e.g., a horizontal direction with respect to the drawing) of the first flexible substrate 100' or the second flexible substrate 500 from an outer side of the flexible display device toward an inner side thereof. The gas barrier layer 520 and the encapsulation part 300 protect the display part 200, preventing or substantially preventing the moisture and oxygen contained in the outside air from penetrating into the display part 200.

The flexible display device according to an exemplary embodiment uses excellent flexible and thin plastic films as the first flexible substrate 100' and the second flexible substrate 500, and includes the encapsulation part 300 including the filler 310, the sealant 320, and the getter layer 330 instead of a thin film encapsulation having a low yield in a long manufacturing process. Accordingly, the flexible display device of the exemplary embodiment may be large and thin, and a high manufacturing yield may be obtained.

Figure 11:
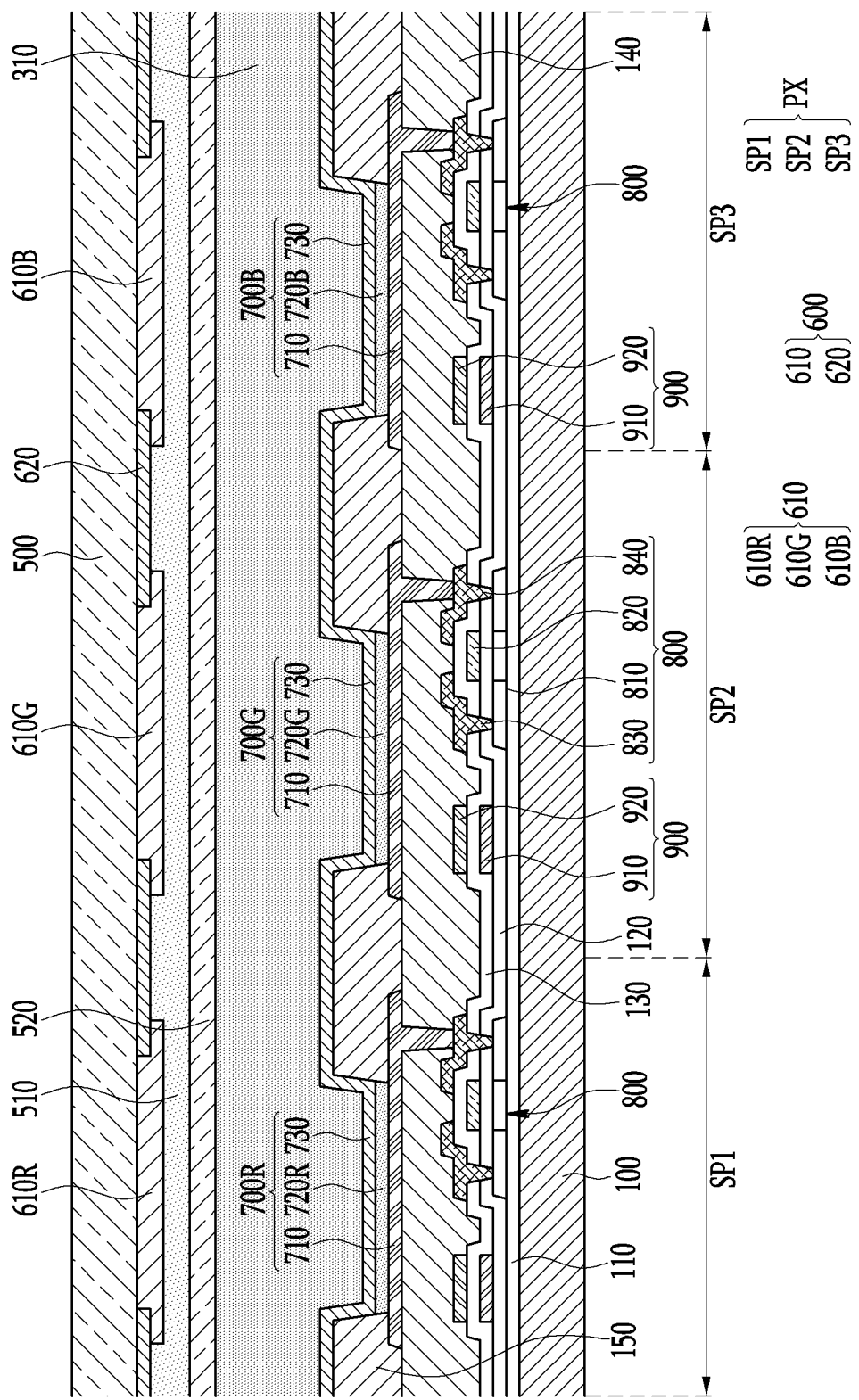
FIG. 11 illustrates a partial enlarged cross-sectional view corresponding to the cross-sectional view of FIG. 5.

FIG. 11 illustrates a partial enlarged cross-sectional view corresponding to the cross-sectional view of FIG. 5. A further detailed structure of the display part will be described with reference to FIG. 11.

Referring to FIG. 11, the buffer layer 110 and the display part 200 are positioned on the first flexible substrate 100. In an embodiment, the first flexible substrate 100 may be made of thin glass or a plastic film, and the buffer layer 110 may be formed as a single layer made of one of a silicon nitride ($SiN_x$), a silicon oxide ($SiO_x$), and a silicon oxynitride (SiON), or a stacked layer thereof.

The display part 200 includes the plurality of pixels PX, and the pixel PX includes the plurality of subpixels. For example, one pixel PX may include the red subpixel SP1, the green subpixel SP2, and the blue subpixel SP3. In an embodiment, at least two thin film transistors 800, at least one capacitor 900, and one light emitting element 700R, 700G, or 700B are positioned for each of the sub-pixels SP1, SP2, and SP3.

A semiconductor layer 810 is positioned on the buffer layer 110. The semiconductor layer 810 may include a polysilicon or oxide semiconductor, and the semiconductor layer 810 including the oxide semiconductor may be covered by an additional passivation layer. The semiconductor layer 810 includes a channel region that is not doped with impurities, and a source region and a drain region that are doped with impurities.

A gate insulating layer 120 may be positioned on the semiconductor layer 810. The gate insulating layer 120 may be formed as a single layer made of a silicon nitride (SiNx) or a silicon oxide (SiOx), or a stacked layer thereof. A gate electrode 820 and a first capacitor plate 910 may be positioned on the gate insulating layer 120. The gate electrode 820 overlaps the channel region of the semiconductor layer 810.

An interlayer insulating layer 130 may be positioned on the gate electrode 820 and the first capacitor plate 910. The interlayer insulating layer 130 may be formed as a single layer made of a silicon nitride (SiNx) or a silicon oxide (SiOx), or a stacked layer thereof. A source electrode 830, a drain electrode 840, and a second capacitor plate 920 may be positioned on the interlayer insulating layer 130.

The source electrode 830 and the drain electrode 840 are respectively connected to the source region and the drain region of the semiconductor layer 810 by a via-hole passing through the interlayer insulating layer 130 and the gate insulating layer 120. The source electrode 830 and the drain electrode 840 may be formed as a multi-layered metal layer, such as molybdenum (Mo)/aluminum (AD/molybdenum (Mo) or titanium (Ti)/aluminum (AD/titanium (Ti).

The second capacitor plate 920 overlaps the first capacitor plate 910, and the first capacitor plate 910 and the second capacitor plate 920 form the capacitor 900 using the interlayer insulating layer 130 as a dielectric material. Alternatively, unlike the above-described configuration, the first capacitor plate 910 may be positioned at the same layer as the semiconductor layer 810, and the second capacitor plate 920 may be positioned at the same layer as the gate electrode 820. In FIG. 11, a top gate type of thin film transistor 800 is shown as an example, but the thin film transistor 800 is not limited to the shown structure.

A planarization layer 140 may be positioned on the thin film transistor 800 and the capacitor 900. The planarization layer 140 may be formed as a single layer made of an inorganic or organic insulation material, or a stacked layer thereof.

A pixel electrode 710 may be positioned on the planarization layer 140. The pixel electrode 710 is disposed at each of the subpixels SP1, SP2, and SP3, and is connected to the drain electrode 840 of the thin film transistor 800 through a via-hole passing through the planarization layer 140. A pixel defining layer (or partition wall) 150 may be positioned on the planarization layer 140 and on an edge of the pixel electrode 710.

Emission layers 720R, 720G, and 720B may be positioned on the pixel electrode 710, and a common electrode 730 may be positioned on the emission layers 720R, 720G, and 720B and the pixel defining layer 150. In an embodiment, the common electrode 730 may be positioned on the entire display area. One of the pixel electrode 710 and the common electrode 730 functions as an anode for injecting holes into the emission layers 720R, 720G, and 720B, and the other thereof functions as a cathode for injecting electrons into the emission layers 720R, 720G, and 720B.

The emission layers 720R, 720G, and 720B may be divided into a red emission layer 720R positioned at the red subpixel SP1, a green emission layer 720G positioned at the green subpixel SP2, and a blue emission layer 720B positioned at the blue subpixel SP3. The emission layers 720R, 720G, and 720B may include an organic emission layer, and may further include at least one of a hole injection layer, a hole transporting layer, an electron transporting layer, and an electron injection layer.

The hole injection layer and the hole transporting layer are positioned between the anode and the organic emission layer, and the electron transporting layer and the electron injection layer are positioned between the cathode and the organic emission layer. The electron and hole are coupled with each other in the emission layers 720R, 720G, and 720B to generate an exciton, and light is emitted by energy generated when the exciton falls from an excited state to a ground state.

In an embodiment, the pixel electrode 710 may be formed as a reflective layer, and the common electrode 730 may be formed as a transparent layer or a semi-transparent layer. Thereby, light emitted from the emission layers 720R, 720G, and 720B is reflected by the pixel electrode 710, and passes through the common electrode 730 and the color filter 600 to be emitted to the outside.

The color filter 600 may include the red filter layer 610R corresponding to the red subpixel SP1, the green filter layer 610G corresponding to the green subpixel SP2, and the blue filter layer 610b corresponding to the blue subpixel SP3. The color filter 600 may include the dark colored layer 620 positioned between the plurality of filter layers 610.

The filter layers 610 absorb light of the remaining wavelength except for wavelengths corresponding to their respective colors among external light incident on the flexible display device, and the dark colored layer 620 absorbs most of the external light. Accordingly, light emitted from any of the emission layers 720R, 720G, and 720B of predetermined colors does not mix with external light of the other wavelengths, and, thus, the flexible display device may suppress reflection of the external light through the color filter 600 and increase color purity.

The color filter 600 is covered with the overcoat layer 510 and the gas barrier layer 520. The overcoat layer 510 protects the color filter 600, improving reliability of the color filter 600, and the gas barrier layer 520 blocks diffusion of out-gas of the color filter 600 toward the display part 200, suppressing degradation of the display part 200.

The display part 200 is primarily sealed by the encapsulation part 300 provided with the filler 310, the sealant 320, and the getter layer 330, and is secondarily sealed by the gas barrier layer 520 having a larger area than the encapsulation part 300. That is, the gas barrier layer 520 performs an additional sealing function to block moisture and oxygen of outside air penetrating from the outside of the encapsulation part 300.

While this disclosure has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a flexible display device, the method comprising:

arranging a buffer layer and a display part on a first flexible substrate;

arranging an encapsulation part including a filler covering the display part and a sealant positioned at an outside of the filler on the display part;

arranging a second flexible substrate on a carrier substrate;

arranging a color filter including a plurality of filter layers and a dark colored layer on the second flexible substrate;

arranging an overcoat layer and a gas barrier layer on the color filter;

stacking the first flexible substrate and the second flexible substrate such that the encapsulation part and the gas barrier layer contact each other, and then curing the sealant; and separating the carrier substrate from the second flexible substrate.

2. The manufacturing method of the flexible display device of claim 1, wherein the first flexible substrate includes glass, and the second flexible substrate is a plastic film.

3. The manufacturing method of the flexible display device of claim 1, wherein a process temperature of the color filter and a process temperature of the gas barrier layer are higher than a process temperature of the display part.

4. The manufacturing method of the flexible display device of claim 1, wherein an area of the gas barrier layer is larger than an area of the overcoat layer and an area of the encapsulation part, and an outer side of the sealant is spaced apart from an outer edge of the gas barrier layer in a direction toward a center of the display part.

5. A manufacturing method of a flexible display device, the method comprising:

arranging a first flexible substrate on a carrier substrate;

arranging a buffer layer and a display part on the first flexible substrate;

arranging an encapsulation part including a filler covering the display part and a sealant positioned at an outside of the filler on the display part;

arranging a second flexible substrate on another carrier substrate;

arranging a color filter including a plurality of filter layers and a dark colored layer on the second flexible substrate;

arranging an overcoat layer and a gas barrier layer on the color filter;

stacking the first flexible substrate and the second flexible substrate such that the encapsulation part and the gas barrier layer contact each other, and then curing the sealant; and separating the carrier substrate from the first flexible substrate, and separating the another carrier substrate from the second flexible substrate.

6. The manufacturing method of the flexible display device of claim 5, wherein the first flexible substrate and the second flexible substrate are plastic films.

7. The manufacturing method of the flexible display device of claim 5, wherein a process temperature of the color filter and a process temperature of the gas barrier layer are higher than a process temperature of the display part.

8. The manufacturing method of the flexible display device of claim 5, wherein an area of the gas barrier layer is larger than an area of the overcoat layer and an area of the encapsulation part, and an outer side of the sealant is spaced apart from an outer edge of the gas barrier layer in a direction toward a center of the display part.

* * * * *